(12) United States Patent
Tatehara et al.

(10) Patent No.: US 6,921,950 B2
(45) Date of Patent: Jul. 26, 2005

(54) SEMICONDUCTOR DEVICE

(75) Inventors: Kenichi Tatehara, Osaka (JP); Norihide Kinugasa, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/294,761

(22) Filed: Nov. 15, 2002

(65) Prior Publication Data

US 2003/0094969 A1 May 22, 2003

(30) Foreign Application Priority Data

Nov. 16, 2001 (JP) .......................... 2001-351463

(51) Int. Cl.$^7$ .............................................. H01L 29/74
(52) U.S. Cl. ...................... 257/372; 257/355; 257/357; 361/111; 361/56; 326/81; 326/121
(58) Field of Search ............................... 257/372, 355, 257/357, 173, 174, 140, 342; 361/56, 111; 326/81, 121

(56) References Cited

U.S. PATENT DOCUMENTS

| | | | |
|---|---|---|---|
| 5,623,156 A | | 4/1997 | Watt |
| 5,945,713 A | | 8/1999 | Voldman |
| 6,329,694 B1 | * | 12/2001 | Lee et al. .................... 257/372 |
| 6,337,787 B2 | * | 1/2002 | Tang ............................ 361/56 |
| 6,351,362 B1 | * | 2/2002 | Inoue et al. ................. 361/111 |
| 6,437,407 B1 | * | 8/2002 | Ker et al. .................... 257/357 |
| 6,515,337 B1 | | 2/2003 | Kato |
| 6,521,951 B2 | * | 2/2003 | Sato et al. ................... 257/355 |
| 6,671,153 B1 | * | 12/2003 | Ker et al. .................... 361/111 |
| 6,690,561 B2 | * | 2/2004 | Hung et al. ................. 361/111 |
| 6,768,619 B2 | * | 7/2004 | Ker et al. ..................... 361/56 |
| 6,770,938 B1 | * | 8/2004 | Fliesler et al. .............. 257/357 |
| 6,801,416 B2 | * | 10/2004 | Hatzilambrou et al. ....... 361/56 |

FOREIGN PATENT DOCUMENTS

| | | |
|---|---|---|
| JP | 63-171032 | 11/1988 |
| JP | 02-007458 | 11/1990 |
| JP | 03-060066 | 3/1991 |
| JP | 07-254684 A | 10/1995 |
| JP | 09-139466 A | 5/1997 |
| JP | 2000-243912 | 8/2000 |

* cited by examiner

*Primary Examiner*—Vibol Tan
(74) *Attorney, Agent, or Firm*—McDermott Will & Emery LLP

(57) ABSTRACT

In order to improve the robustness against electrostatic discharge, when power source terminal and ground terminal are open, of a semiconductor device having a first, a second and a third inverter that are connected in a cascade arrangement, the semiconductor device is provided not only with a first input protection circuit for guiding positive electrostatic discharges, that are applied from outside to a signal input terminal, to a power source line, and a second input protection circuit for guiding negative electrostatic discharges, that are applied from outside to the signal input terminal, to a ground line, but also an internal protection circuit for guiding electrostatic discharges that have been guided by the first input protection circuit to the power source line and flow from a P-channel MOS transistor in the second inverter towards the third inverter, to the ground line.

18 Claims, 7 Drawing Sheets

SEMICONDUCTOR DEVICE

BACKGROUND OF THE INVENTION

The present invention relates to circuit technology for preventing electrostatic damage of semiconductor devices.

Semiconductor devices (semiconductor integrated circuits) are known that have a first input protection circuit for guiding positive electrostatic discharges, that are applied from the outside, to a signal input terminal to a power source line, and a second input protection circuit for guiding negative electrostatic discharges, that are applied from the outside to that signal input terminal, to a ground line. The first and the second input protection circuit are respectively made of diodes, MOS transistors or bipolar transistors (see JP H09-139466A).

It is possible to configure a delay circuit with a plurality of cascaded inverters. The inverters may be configured by P-channel MOS transistors and N-channel MOS transistors. If the above-noted first and second input protection circuits are used for a semiconductor device having such a delay circuit, then the first-stage inverter, which is directly connected to the signal input terminal, can be protected from gate insulation damage when electrostatic discharges are applied to the signal input terminal. However, when positive electrostatic discharges are applied to the signal input terminal while the power source terminal and the ground terminal are open (no-voltage state), for example in the assembly line for the appliance in which the semiconductor device is to be mounted, then the internal inverters may suffer gate insulation damage.

SUMMARY OF THE INVENTION

It is an object of the present invention to improve the robustness against electrostatic discharge of semiconductor devices.

In order to attain this object, a semiconductor device in accordance with the present invention includes a first, a second and a third logic circuit each having a function of inverting a respective input and being directly or indirectly connected in a cascade arrangement; a signal input means for supplying a signal applied from outside through a signal input terminal to the first logic circuit; a power source line capable of supplying a positive power source voltage applied from outside through a power source terminal to the first, second and third logic circuits; a ground line capable of supplying a ground voltage applied from outside through a ground terminal to the first, second and third logic circuits; and furthermore an internal protection circuit interposed on a connection between an output portion of the second logic circuit and an input portion of the third logic circuit and having a path for guiding charges on the connection, that are caused from positive electrostatic discharges on the power source line, to the ground line.

DETAILED DESCRIPTION OF THE INVENTION

Figure 1:
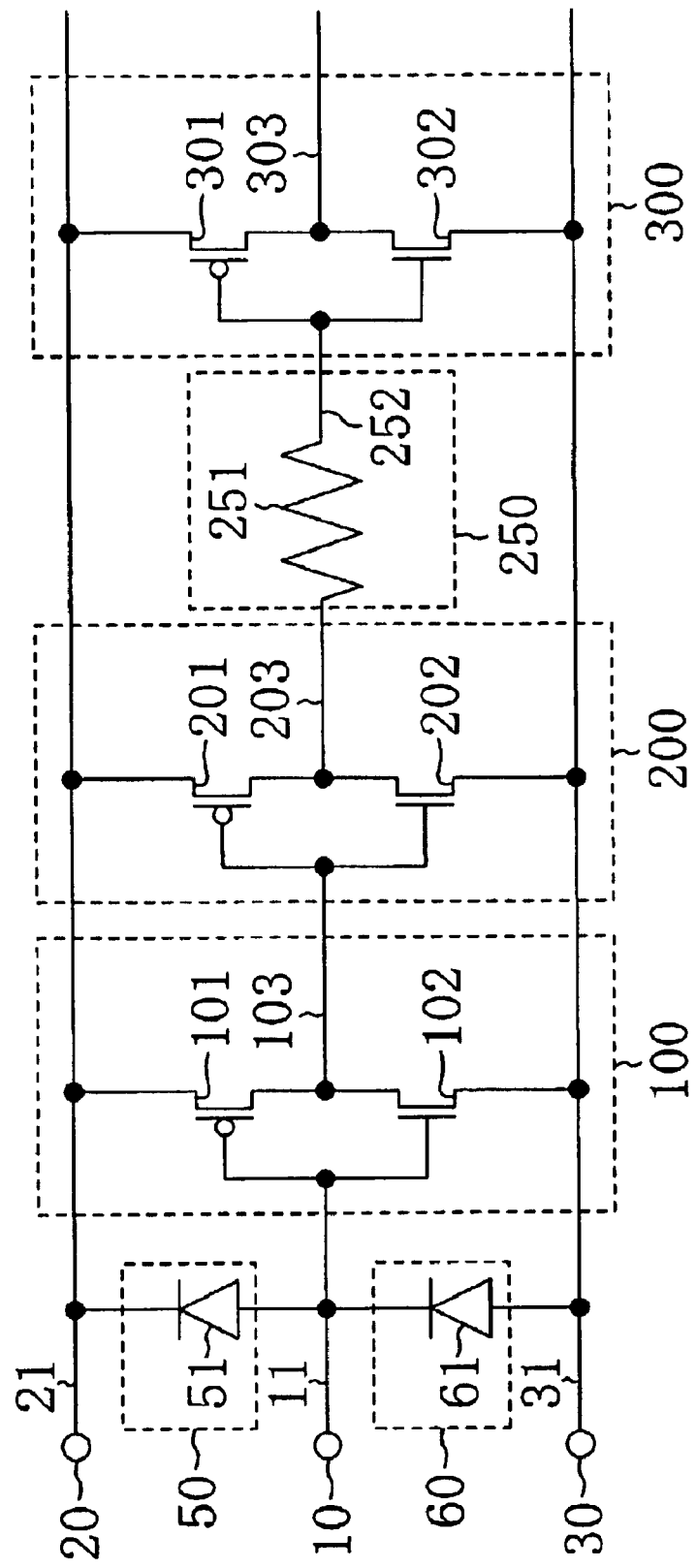
FIG. 1 is a circuit diagram showing a configuration example of a semiconductor device in accordance with the present invention.

FIG. 1 is a circuit diagram showing a configuration example of a semiconductor device in accordance with the present invention. The semiconductor device in FIG. 1 includes a signal input terminal 10, a power source terminal 20, a ground terminal 30, a signal input line 11, a power source line 21, a ground line 31, a first input protection circuit 50, a second input protection circuit 60, a first inverter 100, a second inverter 200, an internal protection circuit 250, and a third inverter 300.

The first, second and third inverters 100, 200 and 300 are cascaded. The first inverter 100 is a CMOS inverter made of a P-channel MOS transistor 101 and an N-channel MOS transistor 102. Numeral 103 denotes the output line of the first inverter 100. Also the second inverter 200 is a CMOS inverter made of a P-channel MOS transistor 201 and an N-channel MOS transistor 202. Numeral 203 denotes the output line of the second inverter 200. Also the third inverter 300 is a CMOS inverter made of a P-channel MOS transistor 301 and an N-channel MOS transistor 302. Numeral 303 denotes the output line of the third inverter 300.

The signal input line 11 supplies signals applied from the outside via the signal input terminal 10 to the first inverter 100. The power source line 20 supplies a positive power source voltage applied from the outside via the power source terminal 20 to the first, second and third inverters 100, 200 and 300. The ground line 31 supplies a ground voltage applied from the outside via the ground terminal 30 to the first, second and third inverters 100, 200 and 300.

The first input protection circuit 50 is made of a diode 51 that guides positive electrostatic discharges, that are applied from the outside to the signal input terminal 10, to the power source line 21. The second input protection circuit 60 is made of a diode 61 that guides negative electrostatic discharges, that are applied from the outside to the signal input terminal 10, to the ground line 31. The internal protection circuit 250 is a circuit for guiding positive electrostatic discharges, that are guided by the first input protection circuit 50 to the power source line 21 and then flow from the P-channel MOS transistor 201 of the second inverter 200 to the third inverter 300, to the ground line 31. The internal protection circuit 250 includes a diffusion resistor 251 formed on the semiconductor substrate and interposed on a connection between an output portion of the second inverter 200 and an input portion of the third inverter 300. Numeral 252 denotes the input line of the third inverter 300.

Figure 2:
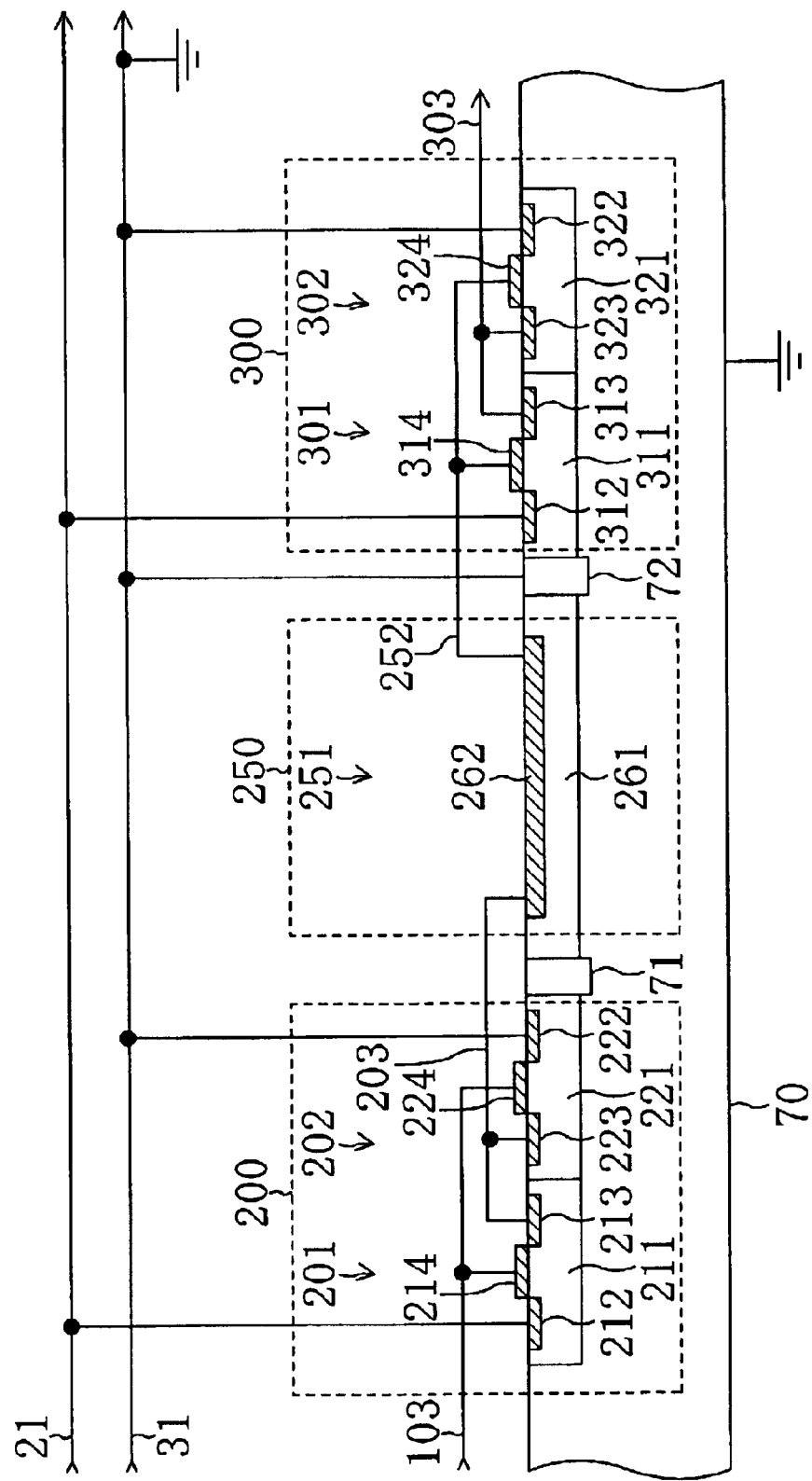
FIG. 2 is a partial cross-sectional view of the semiconductor device in FIG. 1.

FIG. 2 is a partial cross-sectional view of the semiconductor device in FIG. 1. The second inverter 200, the internal protection circuit 250 and the third inverter 300 are formed on a P-type substrate 70. Numerals 71 and 72 both denote P-type isolation regions. The P-channel MOS transistor 201 is made of a P-type diffusion source region 212 and a P-type diffusion drain region 213 respectively formed in an N-type well region 211, and a polysilicon gate electrode 214. The N-channel MOS transistor 202 is made of an N-type diffusion source region 222 and an N-type diffusion drain region 223 respectively formed in a P-type well region 221, and a polysilicon gate electrode 224. The P-type diffusion resistor 251 is made of a P-type diffusion resistance region 262 formed in an N-type epitaxial region 261. Consequently, a parasitic PNP transistor is formed with the P-type diffusion resistance region 262 serving as the emitter, the N-type epitaxial region 261 as the base and the P-type substrate 70 as the collector. Moreover, the P-type substrate 70 and the P-type isolation region 72 are connected to the ground line 31. The P-channel MOS transistor 301 is made of a P-type diffusion source region 312 and a P-type diffusion drain region 313 respectively formed in an N-type well region 311, and a polysilicon gate electrode 314. The N-channel MOS transistor 302 is made of an N-type diffusion source region 322 and an N-type diffusion drain region 323 respectively formed in a P-type well region 321, and a polysilicon gate electrode 324.

With a semiconductor device having the configuration as shown in FIGS. 1 and 2, when positive electrostatic discharges are applied to the signal input terminal 10 while the power source terminal 20 and the ground terminal 30 are open, the first input protection circuit 50 guides these electrostatic discharges to the power source line 21. Thus, the gate insulation of the first inverter 100 is protected. However, by letting the positive electrostatic discharges flow into the power source line 21, the same situation is attained as if a power source voltage were applied from outside to the power source terminal 20. Consequently, the first and second inverters 100 and 200 perform the operation of inverting their input. Here, the signal input line 11, which is connected to the signal input terminal 10, is at H (high) level, so that the first inverter output line 103 becomes L (low) level and the second inverter output line 203 becomes H (high) level. That is to say, the P-channel MOS transistor 201 in the second inverter 200 becomes conductive. As a result, the positive electrostatic discharges from the power source line 21 flow through the P-channel MOS transistor 201 into the second inverter output line 203. Here, when BVCEO (base circuit is open) is taken to be the breakdown voltage between collector and emitter of the parasitic PNP transistor formed by the P-type diffusion resistance region 262, the N-type epitaxial region 261 and the P-type substrate 70, then the parasitic PNP transistor breaks down at the time when the potential of the P-type diffusion resistance region 262 connected to the second inverter output line 203 exceeds BVCEO, and as a result, the electrostatic discharges are diverted to the ground line 31. Thus, the gate insulation of the third inverter 300 is protected.

If negative electrostatic discharges are applied to the signal input terminal 10 while the power source terminal 20 and the ground terminal 30 are open, then the second input protection circuit 60 guides these electrostatic discharges to the ground line 31. Thus, the gate insulation of the first inverter 100 is protected. Moreover, the first and second inverters 100 and 200 do not perform the operation of inverting their input, so that the problem of gate insulating damage in the third inverter 300 does not occur.

It should be noted that it is also possible to use an N-type diffusion resistor instead of the P-type diffusion resistor 251.

Figure 3:
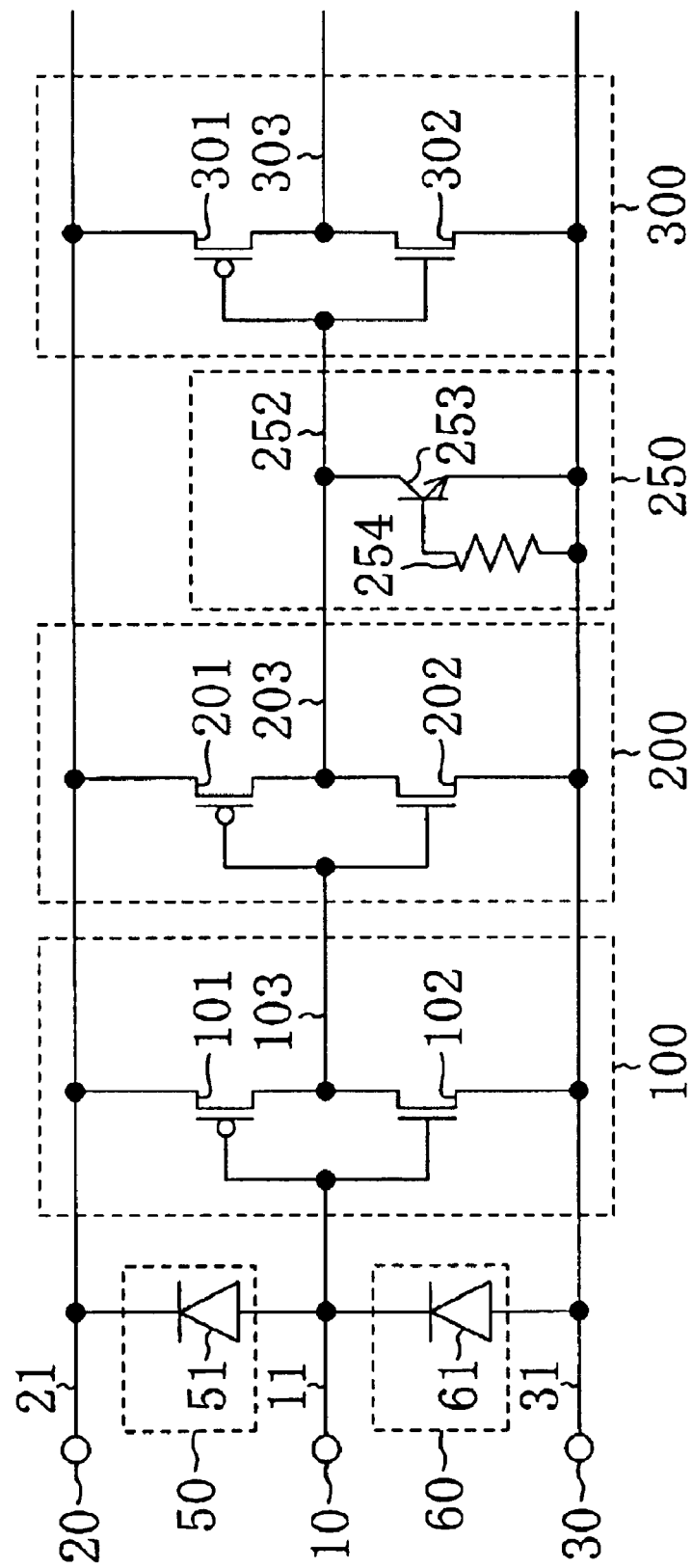
FIG. 3 is a circuit diagram showing another configuration example of a semiconductor device in accordance with the present invention.

FIG. 3 is a circuit diagram showing another configuration example of the semiconductor device in accordance with the present invention. The internal protection circuit 250 in FIG. 3 includes an NPN transistor 253 interposed on a connection between an output portion of the second inverter 200 and the ground line 31. The collector of this NPN transistor 253 is connected to the second inverter output line 203, its emitter is connected directly to the ground line 31, and its base is connected via a P-type diffusion resistor 254 to the ground line 31.

Figure 4:
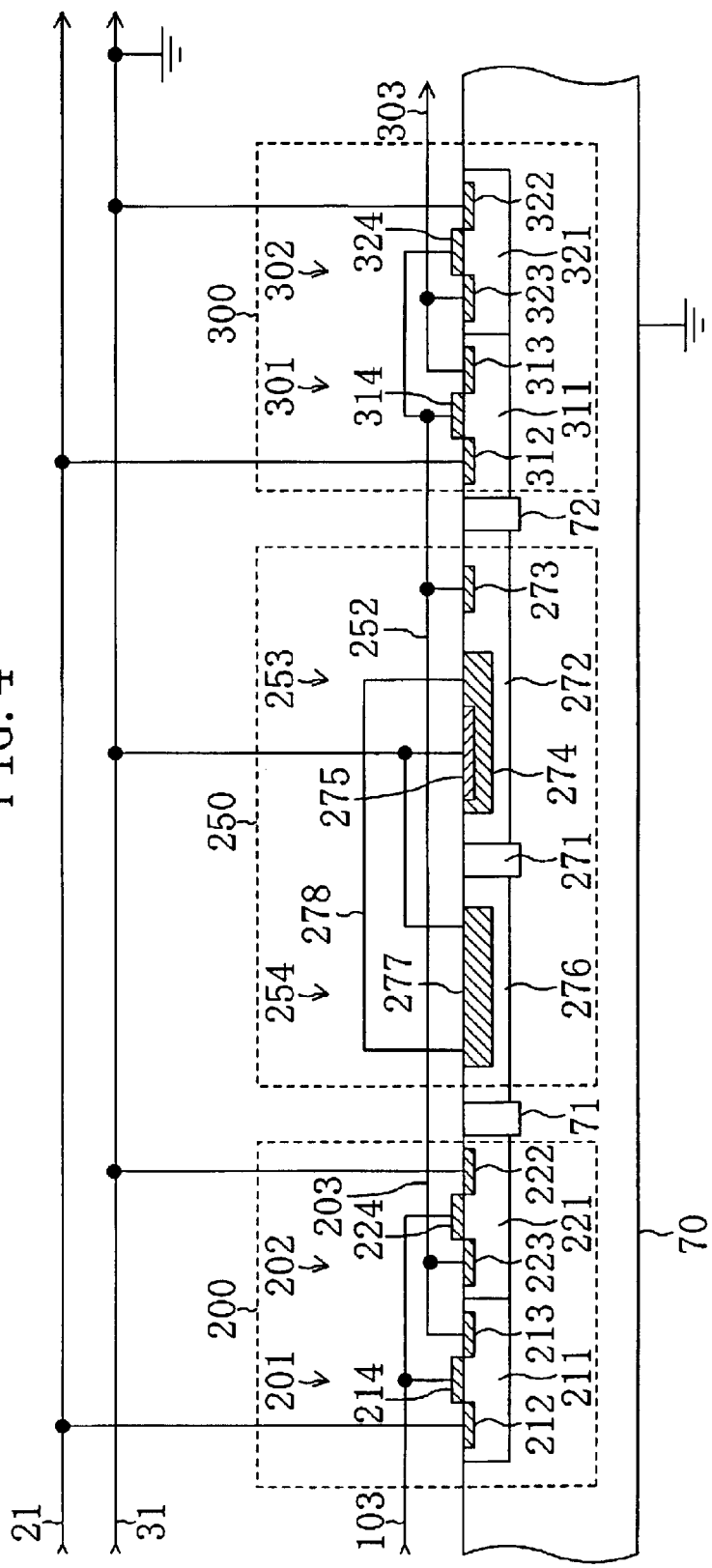
FIG. 4 is a partial cross-sectional view of the semiconductor device in FIG. 3.

FIG. 4 is a partial cross-sectional view of the semiconductor device in FIG. 3. The NPN transistor 253 and the P-type diffusion transistor 254 are formed on the P-type substrate 70. Numeral 271 denotes a P-type isolation region. The NPN transistor 253 is made of an N-type diffusion collector region 273, a P-type diffusion base region 274 and an N-type diffusion emitter region 275, all of which are formed in an N-type epitaxial region 272. The P-type diffusion resistor 254 is made by forming a P-type diffusion resistance region 277 in an N-type epitaxial region 276. Numeral 278 denotes a base line.

Also with a semiconductor device having the configuration shown in FIGS. 3 and 4, when positive electrostatic discharges are applied to the signal input terminal 10 while the power source terminal 20 and the ground terminal 30 are open, these electrostatic discharges flow via the first input protection circuit 50 to the power source line 21, and then the positive electrostatic discharges flow from the power source line 21 through the P-channel MOS transistor 201 into the second inverter output line 203. Here, when BVCER (base circuit grounded by resistor) is taken to be the breakdown voltage between collector and emitter of the NPN transistor 253, then the NPN transistor 253 breaks down at the time when the potential of the N-type diffusion collector region 273 connected to the second inverter output line 203 exceeds BVCER, and as a result, the electrostatic discharges are diverted to the ground line 31. Thus, the gate insulation of the third inverter 300 is protected.

It should be noted that it is also possible to use a PNP transistor instead of the NPN transistor 253.

Figure 5:
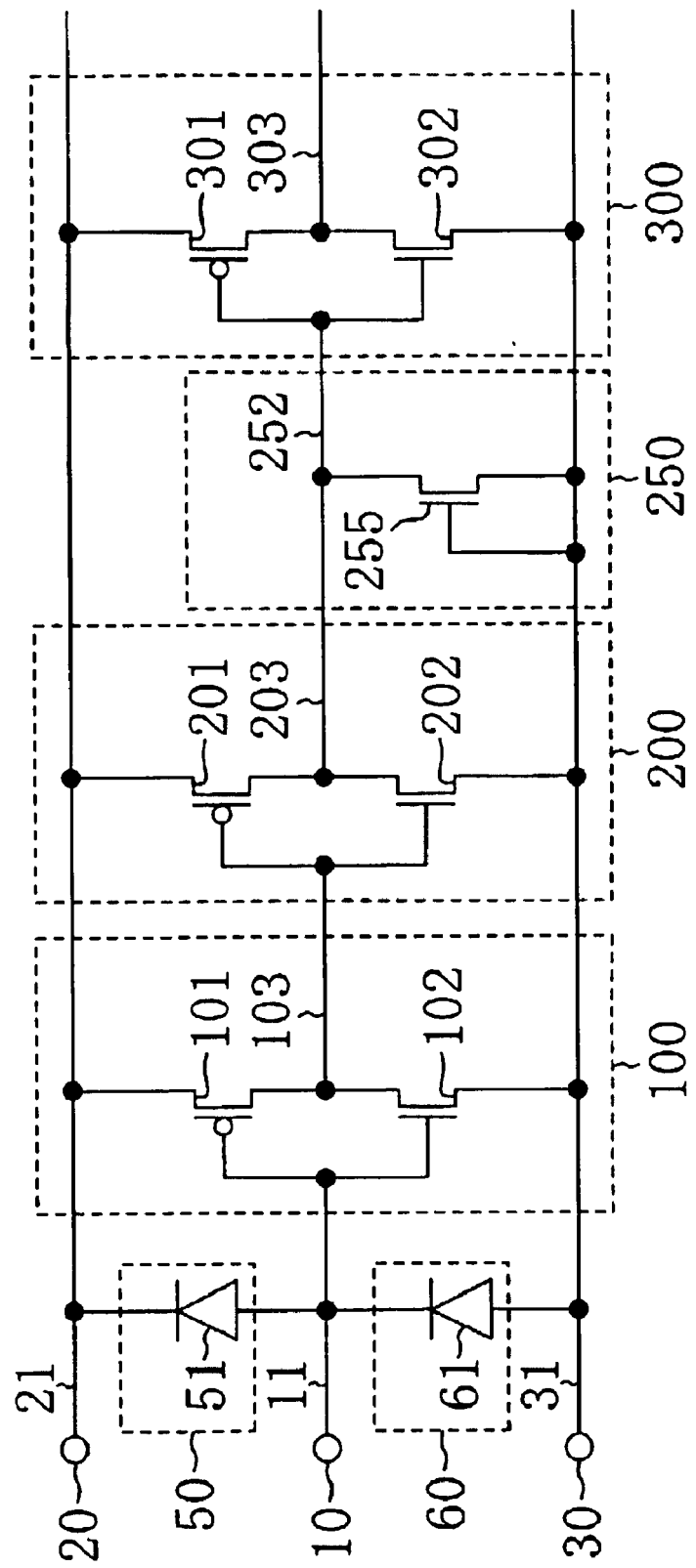
FIG. 5 is a circuit diagram showing yet another configuration example of a semiconductor device in accordance with the present invention.

FIG. 5 is a circuit diagram showing yet another configuration example of the semiconductor device in accordance with the present invention. The internal protection circuit 250 in FIG. 5 includes an N-channel MOS transistor 255 interposed on a connection between an output portion of the second inverter 200 and the ground line 31. The drain of this N-channel MOS transistor 255 is connected to the second inverter output line 203, and the gate and source are both connected to the ground line 31.

Figure 6:
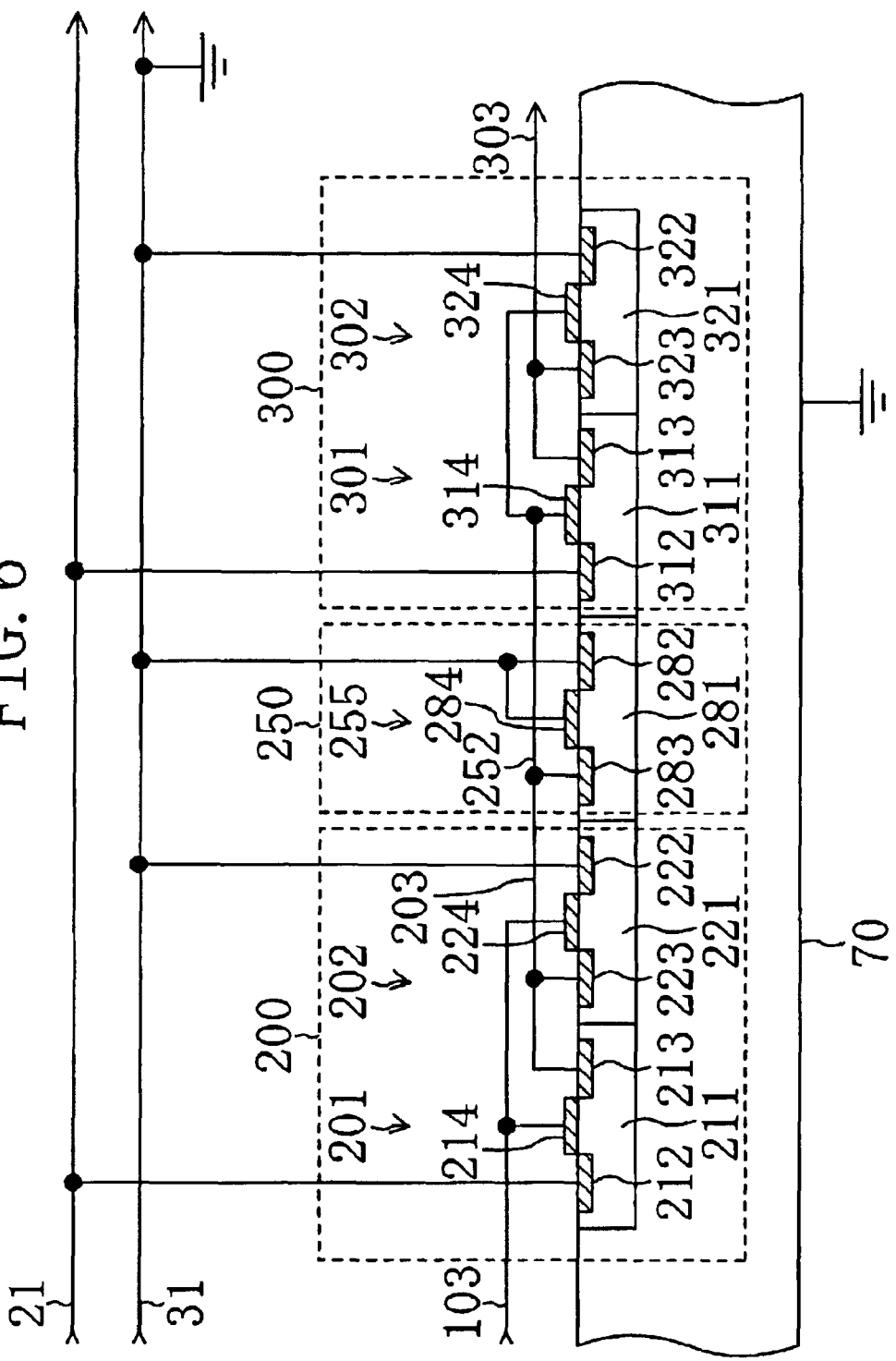
FIG. 6 is a partial cross-sectional view of the semiconductor device in FIG. 5.

FIG. 6 shows a partial cross-sectional view of the semiconductor device in FIG. 5. The N-channel MOS transistor 255 is made of an N-type diffusion source region 282 and an N-type diffusion drain region 283 respectively formed in a P-type well region 281, and a polysilicon gate electrode 284.

Also with a semiconductor device having the configuration shown in FIGS. 5 and 6, when positive electrostatic discharges are applied to the signal input terminal 10 while the power source terminal 20 and the ground terminal 30 are open, these electrostatic discharges flow via the first input protection circuit 50 to the power source line 21, and then the positive electrostatic discharges flow from the power source line 21 through the P-channel MOS transistor 201 into the second inverter output line 203. Here, when BVDS is taken to be the breakdown voltage between drain and source of the N-channel MOS transistor 255, then the N-channel MOS transistor 255 breaks down at the time when the potential of the N-type diffusion drain region 283 connected to the second inverter output line 203 exceeds BVDS, and as a result, the electrostatic discharges are diverted to the ground line 31. Thus, the gate insulation of the third inverter 300 is protected.

It should be noted that it is also possible to use a P-channel MOS transistor instead of the N-channel MOS transistor 255.

Figure 7:
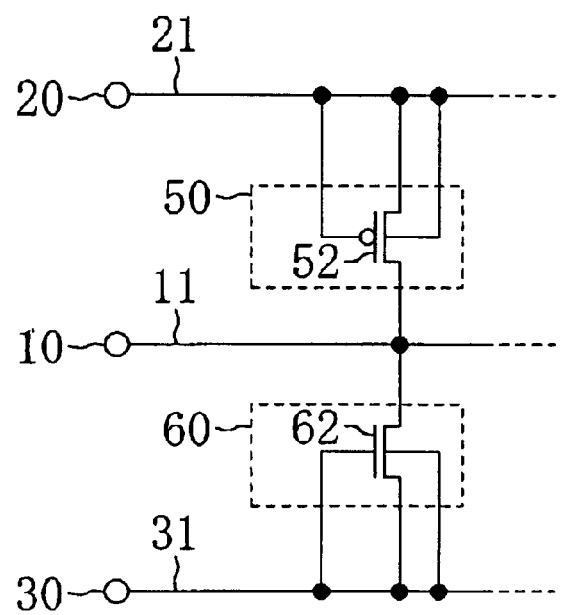
FIG. 7 is a circuit diagram showing an example of a modified configuration of FIGS. 1, 3 and 5.
Figure 8:
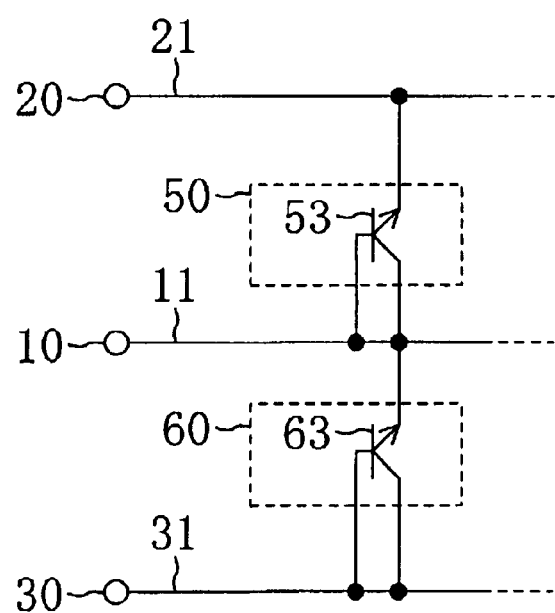
FIG. 8 is a circuit diagram showing another example of a modified configuration of FIGS. 1, 3 and 5.

Needless to say, the first and second input protection circuits 50 and 60 in FIGS. 1, 3 and 5 are not limited to diode structures. As shown in FIG. 7, the first input protection circuit 50 can also be configured by a P-channel MOS transistor 52, and the second input protection circuit 60 can be configured by an N-channel MOS transistor 62. Moreover, as shown in FIG. 8, the first input protection circuit 50 can also be configured by an NPN transistor 53, and the second input protection circuit 60 can be configured by another NPN transistor 63. It is also possible to replace at least one of these NPN transistors 53 and 63 by a PNP transistor.

In the above explanations, the internal protection circuit 250 was inserted between the output portion of the second inverter 200 and the input portion of the third inverter 300, but if necessary, it is also possible to provide similar internal protection circuits at the respective input portions of any odd-numbered inverters of later stages. The invention is not limited to the inverters 100, 200 and 300, but can be applied to any semiconductor device in which a plurality of logic circuits having the function to invert their input, such as NAND gates or NOR gates, are cascaded.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device, comprising:
   a first, a second and a third logic circuit each having a function of inverting a respective input and being directly or indirectly connected in a cascade arrangement;
   a signal input terminal for supplying a signal applied from outside to the first logic circuit;
   a power source line capable of supplying a positive power source voltage applied from outside through a power source terminal to the first, second and third logic circuits;
   an input protection circuit having a path capable of guiding electrostatic discharges, which are applied from outside to the signal input terminal, to the power source line;
   a ground line capable of supplying a ground voltage applied from outside through a ground terminal to the first, second and third logic circuits; and
   an internal protection circuit interposed on a connection between an output portion of the second logic circuit and an input portion of the third logic circuit and having a path capable of guiding electrostatic discharges, which are guided to the power source line by the input protection circuit and derived from the power source line through the second logic circuit to the connection, to the ground line,
   wherein the path of the internal protection circuit is formed by a breakdown of a transistor composing of the internal protection circuit or a parasitic transistor.

2. The semiconductor device according to claim 1, wherein the first and second logic circuits are inverters, each made of a P-channel MOS transistor and an N-channel MOS transistor.

3. The semiconductor device according to claim 1, wherein the input protection circuit has a path capable of guiding the electrostatic discharges, which are applied from outside to the signal input terminal, to the power source line to which the third logic circuit is directly connected, without passing through the power source terminal.

4. The semiconductor device according to claim 1, wherein the input protection circuit is made of one selected from a diode, a MOS transistor and a bipolar transistor.

5. The semiconductor device according to claim 1, wherein the internal protection circuit comprises a semiconductor substrate of a first conductivity type that is connected to the ground line, a semiconductor region of a second conductivity type that is in contact with the semiconductor substrate, and a diffusion resistor of a first conductivity type that is formed in the semiconductor region and on or over the semiconductor substrate, and
   at least one end of the diffusion resistor is connected to a connection between an output portion of the second logic circuit and an input portion of the third logic circuit.

6. The semiconductor device according to claim 5, wherein the internal protection circuit comprises:
   a P-type region connected to the ground line;
   an N-type region formed adjacent to the P-type region; and
   a P-type diffusion region formed by diffusion in the N-type region and interposed in the connection between the output portion of the second logic circuit and the input portion of the third logic circuit.

7. The semiconductor device according to claim 1, wherein the internal protection circuit comprises a bipolar transistor that is interposed in a connection between an output portion of the second logic circuit and the ground line.

8. The semiconductor device according to claim 7, wherein the bipolar transistor is an NPN transistor having a collector connected to the output portion of the second logic circuit, a base, and an emitter connected to the ground line.

9. The semiconductor device according to claim 8, wherein the internal protection circuit comprises:
   an N-type diffusion collector region connected to the output portion of the second logic circuit;
   a P-type diffusion base region formed adjacent to the N-type diffusion collector region; and
   an N-type diffusion emitter region formed by diffusion in the P-type diffusion base region and connected to the ground line.

10. The semiconductor device according to claim 8, further comprising a resistor interposed on a connection between the base of the NPN transistor and the ground line.

11. The semiconductor device according to claim 9, further comprising a P-type diffusion resistance region interposed on a connection between the P-type diffusion base region and the ground line.

12. The semiconductor device according to claim 1, wherein the internal protection circuit comprises a MOS transistor interposed in a connection between an output portion of the second logic circuit and the ground line.

13. The semiconductor device according to claim 12, wherein the MOS transistor is an N-channel MOS transistor having a drain connected to the output portion of the second logic circuit, and a gate and a source both connected to the ground line.

14. The semiconductor device according to claim 13, wherein the internal protection circuit comprises:
   a P-type region;
   an N-type diffusion drain region formed by diffusion in the P-type region and connected to the output portion of the second logic circuit;

a gate electrode connected to the ground line; and an N-type diffusion source region formed by diffusion in the P-type region and connected to the ground line.

15. A method for forming a semiconductor device, the semiconductor device comprising:

a first, a second and a third logic circuit each having a function of inverting a respective input and being directly or indirectly connected in a cascade arrangement;

a signal input terminal for supplying a signal applied from outside to the first logic circuit;

a power source line capable of supplying a positive power source voltage applied from outside through a power source terminal to the first, second and third logic circuits;

an input protection circuit having a path capable of guiding electrostatic discharges, which are applied from outside to the signal input terminal, to the power source line;

a ground line capable of supplying a ground voltage applied from outside through a ground terminal to the first, second and third logic circuits;

a semiconductor substrate of a first conductivity type that is connected to the ground line;

an internal protection circuit interposed on a connection between an output portion of the second logic circuit and an input portion of the third logic circuit, and having a path capable of guiding electrostatic discharges, which are guided to the power source line by the input protection circuit and derived from the power source line through the second logic circuit to the connection, to the ground line, wherein the internal protection circuit is formed by the steps of:

forming a first semiconductor region of a second conductivity type on or over the semiconductor substrate;

forming a second semiconductor region of a first conductivity type in the first semiconductor region by diffusion; and interposing the second semiconductor region between the output portion of the second logic circuit and the input portion of the third logic circuit.

16. A method for forming a semiconductor device, the semiconductor device comprising:

a first, a second and a third logic circuit each having a function of inverting a respective input and being directly or indirectly connected in a cascade arrangement;

a signal input terminal for supplying a signal applied from outside to the first logic circuit;

a power source line capable of supplying a positive power source voltage applied from outside through a power source terminal to the first, second and third logic circuits;

an input protection circuit having a path capable of guiding electrostatic discharges, which are applied from outside to the signal input terminal, to the power source line;

a ground line capable of supplying ground voltage applied from outside through a ground terminal to the first, second and third logic circuits;

a semiconductor substrate of a first conductivity type that is connected to the ground line;

an internal protection circuit interposed on a connection between an output portion of the second logic circuit and an input portion of the third logic circuit and having a path capable of guiding electrostatic discharges, which are guided to the power source line by the input protection circuit and derived from the power source line through the second logic circuit to the connection, to the ground line, wherein the internal protection circuit is formed by the steps of:

forming a first semiconductor region of a second conductivity on or over the semiconductor substrate;

forming a first diffusion region of a first conductivity type in the first semiconductor region;

forming a diffusion region of a second conductivity type that is formed in the first diffusion region of the first conductivity type by diffusion and is connected to the ground line; and connecting the first semiconductor region to the connection.

17. The method according to claim 16, wherein the internal protection circuit is formed by the further steps of:

forming a second diffusion region of a first conductivity type in the first semiconductor region; and connecting one end of the second diffusion region of the first conductivity type to the ground line and connecting the other end of the second diffusion region of the first conductivity type to the first diffusion region of the first conductivity type.

18. A method for forming a semiconductor device, the semiconductor device comprising:

a first, a second and a third logic circuit each having a function of inverting a respective input and being directly or indirectly connected in a cascade arrangement;

a signal input terminal for supplying a signal applied from outside to the first logic circuit;

a power source line capable of supplying a positive power source voltage applied from outside through a power source terminal to a first, second and third logic circuits;

an input protection circuit having a path capable of guiding electrostatic discharges, which are applied from outside to the signal input terminal, to the power source line;

a ground line capable of supplying ground voltage applied from outside through a ground terminal to the first, second and third logic circuits;

a semiconductor substrate of a first conductivity type that is connected to the ground line;

an internal protection circuit interposed on a connection between an output portion of the second logic circuit and an input portion of the third logic circuit and having a path capable of guiding electrostatic discharges, which are guided to the power source line by the input protection circuit and derived from the power source line through the second logic circuit to the connection, to the ground line, wherein a MOS transistor comprising of the internal protection circuit is formed by the steps of:

forming a first diffusion region and a second diffusion region of a second conductivity type on or over the semiconductor substrate;

forming a gate electrode; and connecting the first diffusion region to the connection, and connecting the second diffusion region and the gate electrode to the ground line.

* * * * *